(12) United States Patent
Kunkee et al.

(10) Patent No.: US 9,761,547 B1
(45) Date of Patent: Sep. 12, 2017

(54) CRYSTALLINE TILE

(71) Applicant: Northrop Grumman Systems Corporation, Falls Church, VA (US)

(72) Inventors: Elizabeth T. Kunkee, Manhattan Beach, CA (US); Charles M. Jackson, Huntington Beach, CA (US); Dah-Weih Duan, Torrance, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/295,357

(22) Filed: Oct. 17, 2016

(51) Int. Cl.
| | |
|---|---|
| *H01L 23/02* | (2006.01) |
| *H01L 23/66* | (2006.01) |
| *H01L 23/498* | (2006.01) |
| *H01L 21/48* | (2006.01) |
| *H01L 21/78* | (2006.01) |
| *H01P 5/12* | (2006.01) |
| *H01P 3/08* | (2006.01) |
| *H01P 1/203* | (2006.01) |
| *H03H 7/42* | (2006.01) |

(52) U.S. Cl.
CPC ............ *H01L 23/66* (2013.01); *H01L 21/486* (2013.01); *H01L 21/4853* (2013.01); *H01L 21/78* (2013.01); *H01L 23/49827* (2013.01); *H01L 23/49833* (2013.01); *H01P 1/203* (2013.01); *H01P 3/08* (2013.01); *H01P 5/12* (2013.01); *H03H 7/42* (2013.01); *H01L 2223/6611* (2013.01); *H01L 2223/6627* (2013.01); *H01L 2223/6677* (2013.01); *H01L 2223/6683* (2013.01)

(58) Field of Classification Search
CPC ... H01L 25/065; H01L 25/0652; H01L 23/66; H01L 2223/6605
See application file for complete search history.

(56) References Cited

U.S. PATENT DOCUMENTS

| | | | |
|---|---|---|---|
| 8,080,445 B1 * | 12/2011 | Pagaila | ............ H01L 23/49827 |
| | | | 257/E21.499 |
| 8,809,088 B2 | 8/2014 | Shen et al. | |
| 2012/0056314 A1 * | 3/2012 | Pagaila | ............... H01L 21/4832 |
| | | | 257/734 |
| 2013/0119560 A1 | 5/2013 | Toh et al. | |
| 2014/0035892 A1 | 2/2014 | Shenoy et al. | |

(Continued)

OTHER PUBLICATIONS

Nang, Z.; 3-D Integration and Through-Silicon Vias in MEMS and Microsensors; in Microelectromechanical Systems, Journal of , vol. 24, No. 5; pp. 1211-1244; Oct. 2015.

(Continued)

*Primary Examiner* — Sonya D McCall Shepard
(74) *Attorney, Agent, or Firm* — Patti & Malvone Law Group, LLC

(57) ABSTRACT

A system and method for vertically integrating heterogeneous devices into a 3D tile architecture are disclosed. The system uses high precision microelectronics fabrication techniques and known-good-die to achieve high yield to integrate devices to process radio frequency signals at microwave frequencies of approximately 300 MHz to 300 GHz and above. The inventive architecture is based on a high density of small diameter vias to manage the integrity of electrical interconnects and simplify electrical routing.

10 Claims, 4 Drawing Sheets

(56) References Cited

U.S. PATENT DOCUMENTS

2014/0042638 A1    2/2014   Liu et al.
2014/0110840 A1    4/2014   Wojnowski et al.

OTHER PUBLICATIONS

Hu, D. et al; Embedded glass interposer for heterogeneous multi-chip integration; in Electronic Components and Technology Conference (ECTC); 2015 IEEE 65th; pp. 314-317; May 26-29, 2015.

Zeng, R. et al; A semi-coaxial TGV interposer for high frequency 3D system applications; in Infrared, Millimeter, and Terahertz waves (IRMMW-THz), 2014 39th International Conference on, 1 page; Sep. 14-19, 2014.

Ko, C.T. et al; Novel interposer scheme for 3D integration; in Physical and Failure Analysis of Integrated Circuits (IPFA), 2015 IEEE 22nd International Symposium on the; pp. 517-519, Jun. 29, 2015-Jul. 2, 2015.

Brusberg, L et al; Thin glass based electro-optical circuit board (EOCB) with through glass vias, gradient-index multimode optical waveguides and collimated beam mid-board coupling interfaces; in Electronic Components and Technology Conference (ECTC); 2015 IEEE 65th, pp. 789-798, May 26-29, 2015.

Hashiguchi, H. et al; Temporary spin-on glass bonding technologies for via-last/backside-via 3D integration using multichip self-assembly; in Electronic Components and Technology Conference (ECIC), 2014 IEEE 64th; pp. 856-861; May 27-30, 2014.

Wojnowski, M. et al; Novel embedded Z line (EZL) vertical interconnect technology for eWLB; in Electronic Components and Technology Conference (ECTC), 2015 IEEE 65th, pp. 1071-1076, May 26-29, 2015.

Sato, Y. et al; RF Device Integration on Glass Interposer toward 3D-IPAC Packages; In International Symposium on Microelectronics; vol. 2013, No. 1, pp. 000825-000830; International Microelectronics Assembly and Packaging Society, 2013.

Sawyer, B. et al; Design and Demonstration of 40 micron Bump Pitch Multi-layer RDL on Panel-based Glass Interposers; In International Symposium on Microelectronics, vol. 2015, No. 1; pp. 000379-000385; International Microelectronics Assembly and Packaging Society, 2015.

\* cited by examiner

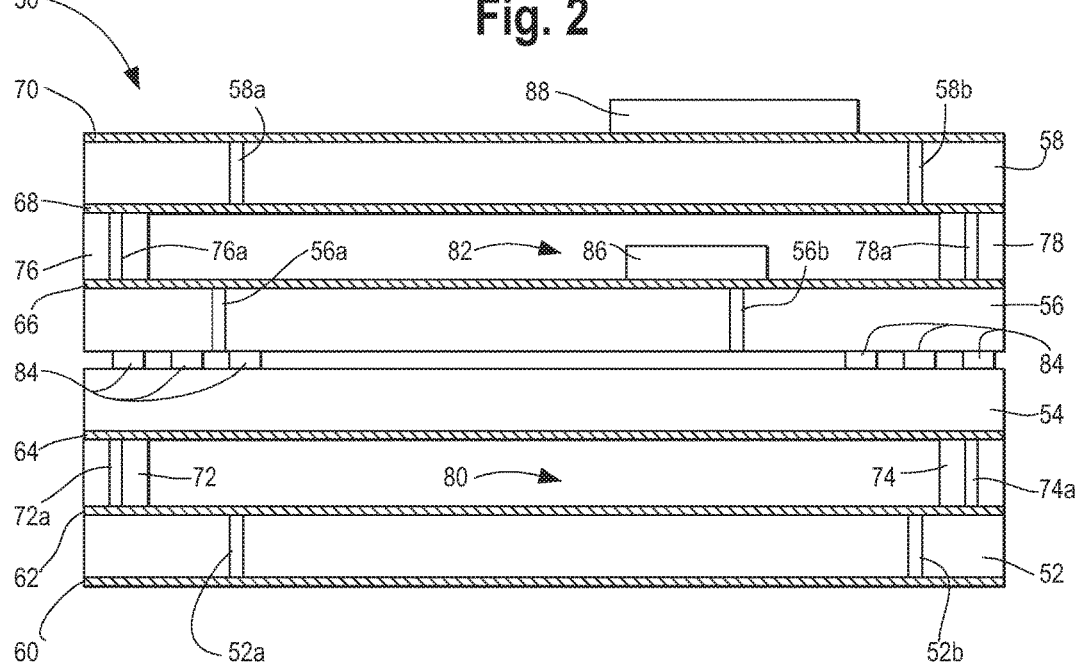
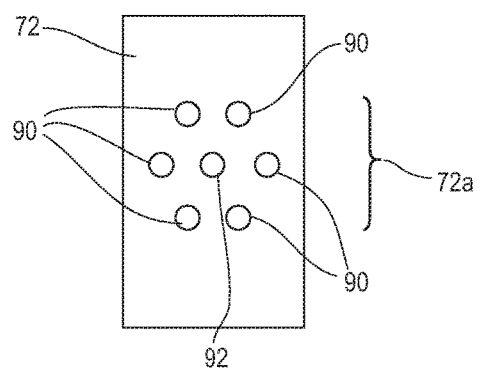

CRYSTALLINE TILE

FIELD OF THE INVENTION

The invention relates generally to 3D packaging of heterogeneous integrated circuits and in particular to 3D packaging of circuits fabricated in heterogeneous material systems.

BACKGROUND OF THE INVENTION

Many applications require assemblies of diverse electronic circuit elements to accomplish a task. For example, antennas which transmit and receive radio frequency (RF) signals require the use of mixers, filters, amplifiers, capacitors, resistors and other circuit elements to generate and process RF signals. A variety of strategies have been used to optimize each individual type of device, or integrated circuit, and integrate them in ever smaller packages.

As frequencies surpassed 10 GHz, Monolithic Microwave Integrated Circuit (MMIC) circuits became increasingly important. These include gallium arsenide (GaAs) and indium phosphide (InP) Heterojunction Bipolar Transistor (HBT) and High-electron-mobility transistor (HEMT) MMICs, as well as microwave transmission lines, high-Q filters, and InP HBT ultra high-speed digital circuits, for example.

As MIMIC chips became smaller, a limiting factor in electronic assemblies was the package size and the space between packages on a printed wiring board (PWB) that formed the electronic assembly. To further decrease assembly size, designers turned to 3D interconnections between dies. One example of this is shown in FIG. 1A, in which a die 10 is stacked on another die 12, also referred to as an interposer, using solder 14 or other metallic bonds. The interposer 12 includes through-wafer vias 16 that connected die 10 to a substrate or packaging (not shown) using solder balls 18. In this prior art, the resistivity of the interposer 12, for example, silicon, is an impediment to operation of interconnect vias at microwave frequencies because this increases the loss to the RF signals. Another technique for decreasing package and PWB size is wafer-level packaging (WLP) wherein diverse types of Integrated Circuits (ICs) are effectively bonded together, forming electrical interconnects, before the wafer is diced into individual circuits. In other words, typical wafer fabrication processes are extended to include device interconnection or packaging steps.

A more complex example of the prior art is shown in FIG. 1B, in which IC dies 26 are mounted on a silicon interposer 28 having vias 30 similar to vias 16 of FIG. 1A. Interposer 28 is used to connect the smaller pitch solder balls 38 with the larger pitch solder balls 34, which are mounted to a packaging substrate 32, such as a printed wiring board (PWB) which has a larger feature size. Packaging substrate 32 may be mounted to further packaging (not shown) by solder balls 36.

Another factor driving development of electronic assemblies is the interest in integrating heterogeneous circuit functionality, for example a high-Q filter and a MIMIC. While it is known to combine various active elements such as transistors and diodes with passive elements such as resistors, capacitors and inductors on a wafer or chip, for example, this solution is not available when the function requires heterogeneous fabrication materials and different, possibly incompatible, manufacturing processes to produce them. As an example of this incompatibility, consider that typical MIMIC fabrication processes are done on wafers thinned to 2, 3, or 4 mil in order to reduce parasitic via inductance, but high-Q filters and ultra-low loss transmission lines, on the other hand, are typically fabricated on the thicker substrates and on substrates such as quartz which has a much lower dielectric constant than GaAs, GaN, or InP.

The prior art techniques as discussed above exhibit a number of problems when used with diverse circuit types and these problems become worse as frequencies climb above 20 GHz. For instance, a Printed Wiring Board (PWB), or softboard, has much larger via diameter, via spacing, and line/space rules than are possible with circuit elements fabricated in a microelectronics foundry, which causes radio frequency (RF) transitions between a MMIC and a PWB to typically have high loss and narrow bandwidth.

Thus, a need exists for a device and method for providing 3D integration of MMICs, filters and associated devices that includes improved high frequency performance, a significant size reduction, and better yield.

SUMMARY OF THE INVENTION

The invention in one implementation encompasses a system and method for vertically integrating heterogeneous devices into a 3D tile architecture that uses high precision microelectronics fabrication techniques and known-good-die to achieve high yield, and is based on a high density of small diameter vias to manage the integrity of electrical interconnects and simplify electrical routing.

BRIEF DESCRIPTION OF THE DRAWINGS

Features of example implementations of the invention will become apparent from the description, the claims, and the accompanying drawings in which:

FIG. 2 depicts a side review of a 3D architecture according to the present invention.

FIG. 3 depicts a top view of a vertical interconnect standoff chip as shown in FIG. 2.

DETAILED DESCRIPTION OF THE INVENTION

Figure 1A:
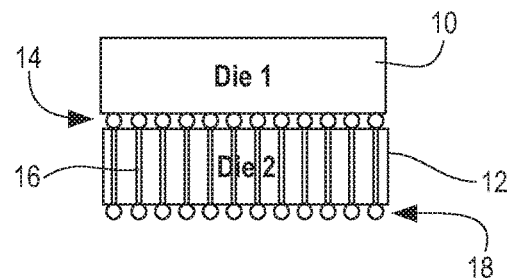
FIGS. 1A-1B depict prior art 3D integrated circuit architectures.
Figure 1B:
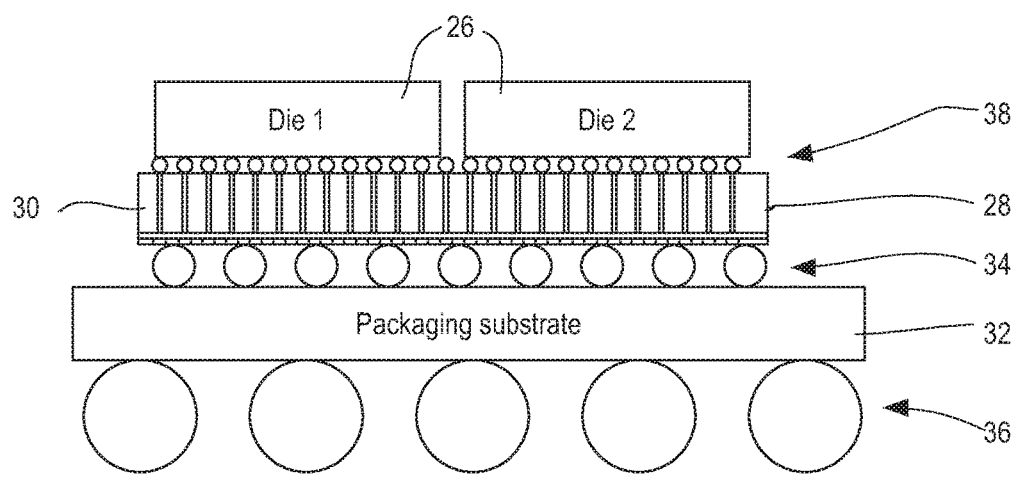

The invention encompasses a new architecture that takes advantage of microelectronics fabrication techniques in order to create an electronics assembly that includes all of the components which previously might have been interconnected on a PWB and integrates them more compactly and with better performance. These components include, for example, high-precision microwave transmission lines, 3D routing, high-precision high-Q filters and MIMIC known-good-die.

By using microelectronics fabrication techniques and tools together with the concepts described in this invention, the impedance of vertical interconnects can be precisely controlled, thereby enabling integration with circuits which are sensitive to electromagnetic reflections (return loss). The assembly constitutes a significant size reduction over the prior art, primarily due to the greatly reduced diameter and reduced pitch of the vertical RF interconnect, and substantially increases the performance consistency (yield) over earlier approaches.

The invention uses a plurality of crystalline interposers that feature through-substrate electrical vias and multiple layers of metal interconnect on the top and bottom of the interposer. The crystalline interposers are stacked using crystalline stand-off blocks which also have both through-substrate vias that form 3D vertical interconnects and multiple layers of interconnect metal. The stacked crystalline interposers and standoffs form the basis for the inventive crystalline tile architecture.

The crystalline tile architecture further provides areas for die to be attached on either side of a crystalline interposer within the tile, or on the top of the tile. The MIMIC die are attached using a chip bonder that can pick, place, and bond chips with 3 micron alignment precision (0.1 mil). Chips can be attached with a variety of options which include a) solder balls, b) gold-gold thermocompression attach techniques, c) epoxy attach with ribbon bonded electrical connections, or d) WLP-type In/Au interconnect bonds. The use of the chip bonder allows the use of Known-Good-Die (KGD) for the MMIC chips, thereby improving overall yield.

The crystalline tile architecture has similar functionality to a PWB, but is fabricated and assembled in a different way. Rather than photolithographic fabrication layer by layer, interposers and vertical interconnect standoff chips can be fabricated simultaneously as different fields on the wafers of a single microelectronics process, or fabricated separately with multiple or different processes. Once fabricated, the wafers are diced to form separate interposers and vertical interconnect standoff chips. The interposers and vertical interconnect standoff chips are then assembled using the chip bonder, which resembles a pick and place tool with the added functionality of being able to apply heat, pressure, and forming gas. The inventive concept is to bond an assembly that is built up from vertical interconnect standoff chips, routing tiles, high-precision stripline filter tiles, MMIC chips, and capacitor and resistor discretes. In effect, the crystalline tile is fabricated at the same time as it is populated with semiconductor components. After assembly, interconnection to system circuitry could be done in a variety of ways, for instance by mounting the crystalline tile to a PWB or using fuzz buttons, pogo pins, or other interconnections.

In an embodiment, an individual interposer uses rows of closely spaced vias in order to provide via fences for effective electro-magnetic isolation of filters, transmission lines, and other circuitry which has been fabricated on the interposer. These via fences enable designs to be optimized with minimal electromagnetic interactions between circuit elements.

A side view representation of the inventive crystalline tile architecture 50 is shown in FIG. 2. A plurality of interposers 52, 54, 56 and 58 are stacked to form 3D crystalline tile package 50. In an embodiment, the interposers are made of quartz but any hard dielectric substrate having high resistivity could be used, for example, glass, silicon carbide (SiC) or alumina. In a further embodiment, the interposers are 15 mil thick but could also have other thicknesses, for example, 10 mil or 5 mil.

Interposer 52 includes through-substrate vias (TSVs) 52a and 52b. Although only two vias are shown at specific locations in interposer 52, one of ordinary skill in the art would understand that there could be any number of vias and they could be located at any position in the interposer as needed for an overall circuit design. Vias are hermetically filled with a conductor such as silver or copper and the exact composition of the fill may be adjusted to obtain coefficient of thermal expansion (CTE) matching to the interposer dielectric. Interposer 52 also includes one or more layers of interconnect metal 60 and 62 that are fabricated using various microelectronic fabrication techniques. Although shown on both sides of interposer 52, these layers may be fabricated on only one or neither side as needed for a particular circuit design. In addition, each of layers 60 and 62 may include more than one layer of metal to form, for example, stripline metal routing lines, RF transmission lines, Wilkinson splitters, RF filters, and other active and passive circuits including couplers, baluns and antennas.

Interposer 54 has one interconnect metal layer 64. It is stacked on interposer 52 through the use of vertical interconnect standoff chips 72 and 74. In an embodiment, vertical interconnect standoff chips 72 and 74 are 15 mil thick quartz but could also have other thicknesses, for example, 10 mil or 5 mil, and could be made from other hard dielectric material as explained above for the interposers. Vertical interconnect standoff chips 72 and 74 include vias 72a and 74a to provide a vertical transmission line between interposers 52 and 54, as explained below in connection with FIG. 3. Similarly to interposer 52, which includes metal layers 60 and 62, it is understood that vertical interconnect standoff chips 72 and 74 also include one or more metal layers on their top and bottom surfaces to form via pads, matching elements, routing traces, etc. for bonding and interconnection purposes. In a similar manner, interposers 56 and 58 are shown with through-substrate vias 56a, 56b, 58a and 58b, and interconnect metal layers 66, 68 and 70. They are stacked through the use of vertical interconnect standoff chips 76 and 78, which also have vertical interconnects 76a and 78a, and patterned metal layers.

Vertical interconnect standoff chips 72 and 74 create a cavity 80 between interposers 54 and 52. Likewise, vertical interconnect standoff chips 76 and 78 create a cavity 82 between interposers 56 and 58, providing space for a MMIC chip 86 to be mounted on interposer 56. Although one MMIC chip 86 is shown, any number of chips can be mounted within cavity 82 on either or both of layers 66 or 68 as needed for a given circuit design. Similarly, any number of MMIC chips can be mounted within cavity 80.

Crystalline tile 50 also includes component 88 fabricated or mounted on the top of interposer 58. Component 88 may be, for example, a planar antenna element such as a slot antennas or an array of silicon micro-machined lens antennas.

Although interposers can be connected by means of vertical interconnect standoff chips to form cavities as described above, in an embodiment, interposers can also be directly bonded to each other, as shown for interposers 54 and 56, which are connected by, for example, gold-gold bonds 84.

A top view of one vertical interconnection 72a in the vertical interconnect standoff chip 72 of FIG. 2 is shown in FIG. 3. Although FIG. 3 depicts a particular vertical interconnection, one of ordinary skill in the art would understand that this description could be applied to any of the vertical interconnections discussed herein. Vertical interconnect standoff chip 72 includes a plurality of through-substrate vias (TSVs). They are arranged in a ring of ground vias 90 around center RF conductor 92 so as to form a coaxial vertical transmission line. In an embodiment, each via has diameters of approximately 2 mil or 50 µm, and the vertical interconnection 72a has an overall width of approximately 11 mil or 280 µm. In contrast, a via in a conventional board is 10 mils in diameter, so that in typical softboard a vertical shielded interconnect has a diameter on the order of 800 microns (32 mils).

Even though only one vertical interconnection is shown in FIG. 3, one may place multiple or an array of vertical interconnections in a vertical interconnect standoff chips, as well as routing transmission lines.

Although a single set of TSVs forming a coaxial vertical transmission line in a generally rectangular vertical interconnect standoff chip 72 is shown in FIG. 3, one of ordinary skill in the art would understand that a vertical interconnect standoff chip may have a variety of lengths and widths as dictated by circuit design and available manufacturing techniques. In this invention, the via could have a smaller diameter and then the ring of ground vias could be more tightly spaced. In another embodiment, laser dicing would allow standoffs to have rounded corners or to be made in L or T-shapes, for instance. Vertical interconnect standoff chips could also be manufactured in the shape of a frame, allowing vertical interconnections along all of the edges of the crystalline tile or even forming a vertical interconnection pillar in the middle.

Figure 4:
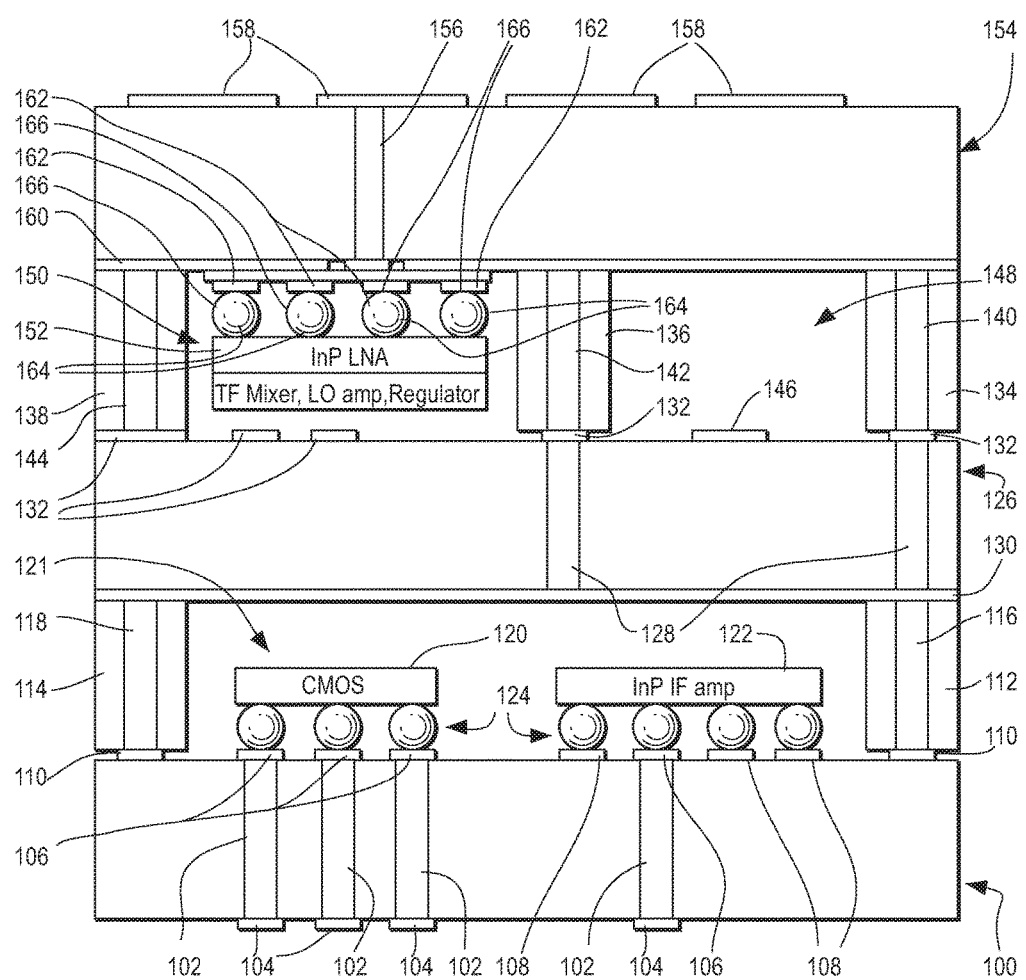
FIG. 4 depicts a more detailed side view of a schematic of the 3D architecture according to the present invention.

A more detailed view of the inventive 3D architecture is shown in FIG. 4. Although specific dimensions and IC arrangements are discussed and shown it should be understood that these are representative and could vary according to the needs of a particular circuit design. FIG. 4 includes interposer 100 as a lowest layer in a crystalline tile architecture. As explained above, interposer 100 includes metalized through-substrate vias 102 between via landing pads, metallized transmission lines, or DC interconnect lines 104 on the lower surface of interposer 100 and landing pads 106 on the upper surface of interposer 100. Interposer 100 is two dimensional surface having a length and width of approximately 1 inch, for example.

Microelectronics processes of deposition, patterning and etching are used to create features on either or both surfaces of an interposer such as via landing pads 104, 106, 108 and 110 for example. Microelectronics processes can also be used to create other circuit elements such as transmission lines between bonding pads for integrated KGD, chip capacitors or chip resistors. Landing pads 110 on the upper surface of interposer 100 are coupled to transmission lines, DC interconnects on the upper surface of interposer 100 as well as metalized vias 116 and 118 in stand-offs 112 and 114 respectively.

While microelectronics processes can be used to create circuitry directly on the surface of an interposer, the invention also encompasses mounting heterogeneous MMIC chips, such as a CMOS beamforming chip 120 or InP IF (intermediate frequency) amplifier 122 on a surface of interposer 100 using solder balls 124 coupled to landing pads 106, 108, for example. In an embodiment, solder balls 124 that have been deposited onto to landing pads 106, 108 are reflowed to create permanent electrical interconnections. As explained above, MMIC 120 and 122 are located in a cavity 121 between interposers 100 and 126 formed by standoffs 112 and 114.

A second interposer 126 is stacked on vertical interconnect standoff chips 112 and 114. As shown, the upper and lower surfaces of interposer 126 include one or more interconnect metal layers. The lower surface includes layer 130 while the upper surface of interposer 126 is processed using microelectronics processes to form bonding pads, signal re-distribution and DC routing 132. Stand-offs 134, 136 and 138 include vias 140, 142 and 144 respectively. Vertical interconnect standoff chips 134 and 136 create a cavity 148 for a high Q filter 146 fabricated on the upper surface of interposer 126. Vertical interconnect standoff chips 136 and 138 also create a cavity 150 for MIMIC KGD such as InP LNA (low noise amplifier) 152 mounted to the underside of interposer 154. In this example, the InP LNA 152 is mounted by means of solder balls 164 coupled to bonding pads 166. Layers 160 and 162 are fabricated using microelectronics techniques to provide further interconnections between interposer 154 and LNA 152.

Vertical interconnection 156 in interposer 154 provides a connection to, for example, to antenna components 158 fabricated using MEMS processes.

In an embodiment, the crystalline tile architecture according to the present invention as shown in FIG. 4 provides the same functionality as a prior art PWB, but is capable of operating at frequencies of up to 300 GHz. This is possible because all components including interposers and vertical interconnect standoff chips are made using high precision microelectronic fabrication techniques, for instance evaporated metal with a design rule of 1 um line/1 um space and 0.1 um tolerance, as compared to a typical 254/482 micron line/space design rule for softboard (PWB). Additionally, the crystalline tile architecture provides a way to tightly integrate MIMIC die with high-precision, high-Q filters so that there is minimal RF transition loss and a high degree of manufacturing repeatability. According to an embodiment, filter topologies include stripline, coplanar waveguide (CPW), microstrip filters, and comb-line filters.

In a further embodiment, the inventive crystalline tile architecture is inherently much smaller than a module with similar functionality. The size reduction is due to the use of EM via fences instead of the metal walls that are used by modules that incorporates a PWB or routing RF signals using alumina or quartz substrate transmission lines. The crystalline tile is made of quartz or SiC therefore it has a predictable and well known dielectric constant, does not bend or change size, and has a fixed coefficient of thermal expansion (CTE). The repeatability and determinism of the material parameters of a hard substrate such as quartz or SiC make the crystalline tile manufacturable with extreme repeatability. A further advantage of the crystalline tile architecture is the ability to support low-loss and single-mode transmission of RF signals up to, say, 300 GHz with the currently available technology of 5.5-mil via pitch on 10-mil thick quartz, or 600 GHz in the future with 3.2-mil via pitch on 5-mil thick quartz for instance.

Figure 5:
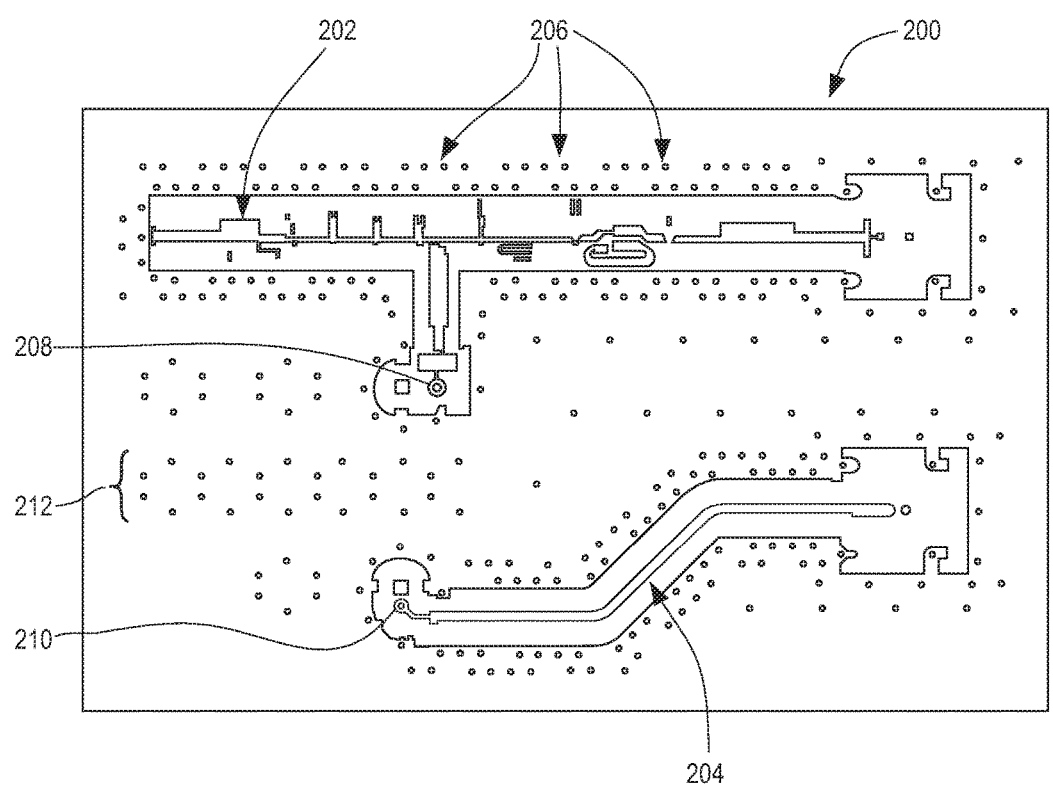
FIG. 5 depicts top view of a portion of a wafer fabricated in accordance with the present invention.

In an embodiment, the crystalline tile architecture according to the present invention is manufactured using microelectronics fabrication techniques on a wafer as shown in FIG. 5. FIG. 5 depicts a top view of a portion of tile 200, which is manufactured as part of a wafer. As explained above, the wafer is quartz but any hard dielectric substrate having high resistivity could be used. TSVs are formed in tile 200, and then one or more circuit features are fabricated using metallization layers on either or both sides of tile 200. Although specific numbers and arrangements of circuit features and TSVs are shown, one of ordinary skill in the art would understand that any arrangement could be used in order to meet the needs of a specific circuit design.

The particular circuit features depicted in FIG. 5 include 3-port filter 202 and transmission line 204. Both of these circuit features are surrounded by vias, shown representatively at 206, which form an electromagnetic via fence. Additional vias, shown, for example at 208 and 210, indicate a vertical interconnection through tile 200 such as, for example, via 128 of FIG. 4. Vias arranged in a circle, shown representatively at 212, form a vertical interconnect as shown, for example, in FIG. 3 and at 118 in FIG. 4

The features described above provide for the combination of WLP MMIC technology, CMOS technology, and DAHI technology with high precision and high-Q filters, to make a next generation 3D integrated microwave circuit. These circuits will be important for phased array tile concepts, but also in other locations in the microwave signal path where size/weight reduction and high performance will be needed. For instance, Cube Sats will require high levels of integration and future payloads for space, and avionics will need to become much smaller to increase mission value.

A first step in the inventive method is fabricating quartz wafer with through-substrate vias according to a circuit design. In an embodiment, the vias have a diameter of approximately 50 microns and are hermetically filled with silver. In an embodiment, the quartz wafer includes both interposers and standoffs.

A next step is to use WLP processing steps to fabricate a high-Q filter, for example, a stripline, CPW, microstrip, or comb-line filter on a surface of the quartz wafer.

A next step is to attach known-good-die MMIC chips to interposers.

A next step is to dice the processed wafer into interposers and standoffs. This step can be performed with a saw to make straight cuts, or a laser, which enables curved cuts and other shapes as dictated by the circuit design. Finally, the interposers and standoffs are assembled using a chip bonder into a 3D assembly.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A crystalline tile electronics assembly, comprising:
   a plurality of crystalline interposers, each interposer comprising a plurality of through-substrate vias (TSVs);
   a plurality of crystalline standoffs, each standoff including one or more TSVs, wherein said plurality of crystalline standoffs are interleaved with the plurality of crystalline interposers so as to form a stack with cavities between the interposers;
   one or more Monolithic Microwave Integrated Circuit (MMIC) devices in the cavities between the interposers created by the standoffs; and
   one or more transmission lines on a surface of a first interposer, said one or more transmission lines interconnecting at least one MIMIC device to a vertical interconnection formed by the one or more TSVs in one of the a standoffs, and wherein said TSVs in the first interposer form a via fence to provide isolation for the one or more transmission lines.

2. The assembly of claim 1, further comprising one or more filters on a surface of one of the interposers.

3. The assembly of claim 1, wherein TSVs in the interposer are arranged to form a via fence for the one or more filters.

4. The assembly of claim 1, wherein the MMIC devices are known-good-die (KGD).

5. The assembly of claim 1, further comprising an antenna element fabricated on an outer surface of the top crystalline interposer of the stack of crystalline standoffs and crystalline interposers of the crystalline tile electronics assembly.

6. The assembly of claim 1, wherein the crystalline interposers further comprise one Or more metal interconnect layers on one or more surfaces of the crystalline interposers, said metal interconnect layers forming electrical connections between devices in the assembly.

7. The assembly of claim 1, further comprising circuitry fabricated on the surface of at least one crystalline interposer, said circuitry including active and passive circuits.

8. The assembly of claim 1, wherein the crystalline standoffs further comprise glass, quartz, SIC or alumina crystalline standoffs.

9. The assembly of claim 1, wherein the crystalline interposers further comprise glass, quartz, silicon carbide (SiC) or alumina crystalline interposers.

10. The assembly of claim 6, wherein said circuitry comprises stripline metal routing lines, RF transmission lines, Wilkinson splitters, RF filters, couplers, baluns or antennas.

* * * * *